Feb. 23, 1971 I. B. TICE, JR 3,566,291

FILTER CIRCUIT

Filed April 7, 1969

INVENTOR
Ira B. Tice, Jr.

Shlesinger, Arkwright & Garvey
ATTORNEYS

United States Patent Office 3,566,291

Patented Feb. 23, 1971

3,566,291

FILTER CIRCUIT

Ira B. Tice, Jr., 5200 Myer Court, Rockville, Md. 20853

Filed Apr. 7, 1969, Ser. No. 813,849

Int. Cl. H03f *3/04*

U.S. Cl. 330—21 12 Claims

ABSTRACT OF THE DISCLOSURE

Two successive differential amplifier stages have a signal input simultaneously applied thereto, a frequency selective inverse feedback circuit connected to the first stage, and the first stage output also being applied to the second differential amplifier stage.

SUMMARY OF INVENTION

This invention relates to frequency filter circuits and particularly to circuits that are used with commercial and industrial sound systems.

In commercial sound equipment, there has always been the problem of eliminating undesirable frequencies in the audio output which result from either the equipment itself, or by extraneous frequencies caused by external sources. Frequency interference resulting from nearby machinery, or acoustical feedback in a loudspeaker system are two of the more common causes of frequency interference. Heretofore, complex, bulky and expensive apparatus have been required to counteract this interference. In many instances the formally used techniques were not able to effectively eliminate the interfering frequency.

Accordingly, it is a principal object of this invention to provide a means for eliminating undesirable frequencies from commercial and industrial sound systems.

It is a further object of this invention to provide a filter system which has a wide tuning range and is highly selective.

It is a still further object of this invention to provide a compact, relatively inexpensive frequency filter circuit for removing an undesirable frequency from an audio wave.

It is a still further object of this invention to provide a simple tunable frequency elimination circuit which can readily be used with existing commercial and industrial sound equipment without requiring modification of the equipment.

It is a still further object of this invention to provide a filter for undesirable frequencies which has an extremely wide tuning range.

It is a still further object of this invention to provide a new type of frequency filter using the principle of differential cancellation.

It is another object of this invention to provide a differential frequency filter having a wide range, very fine tuning, and high attenuation.

These and other objects and advantages of this invention will become more apparent from a reading of the following specification and claims.

DESCRIPTION OF INVENTION

Figures 1, 2:
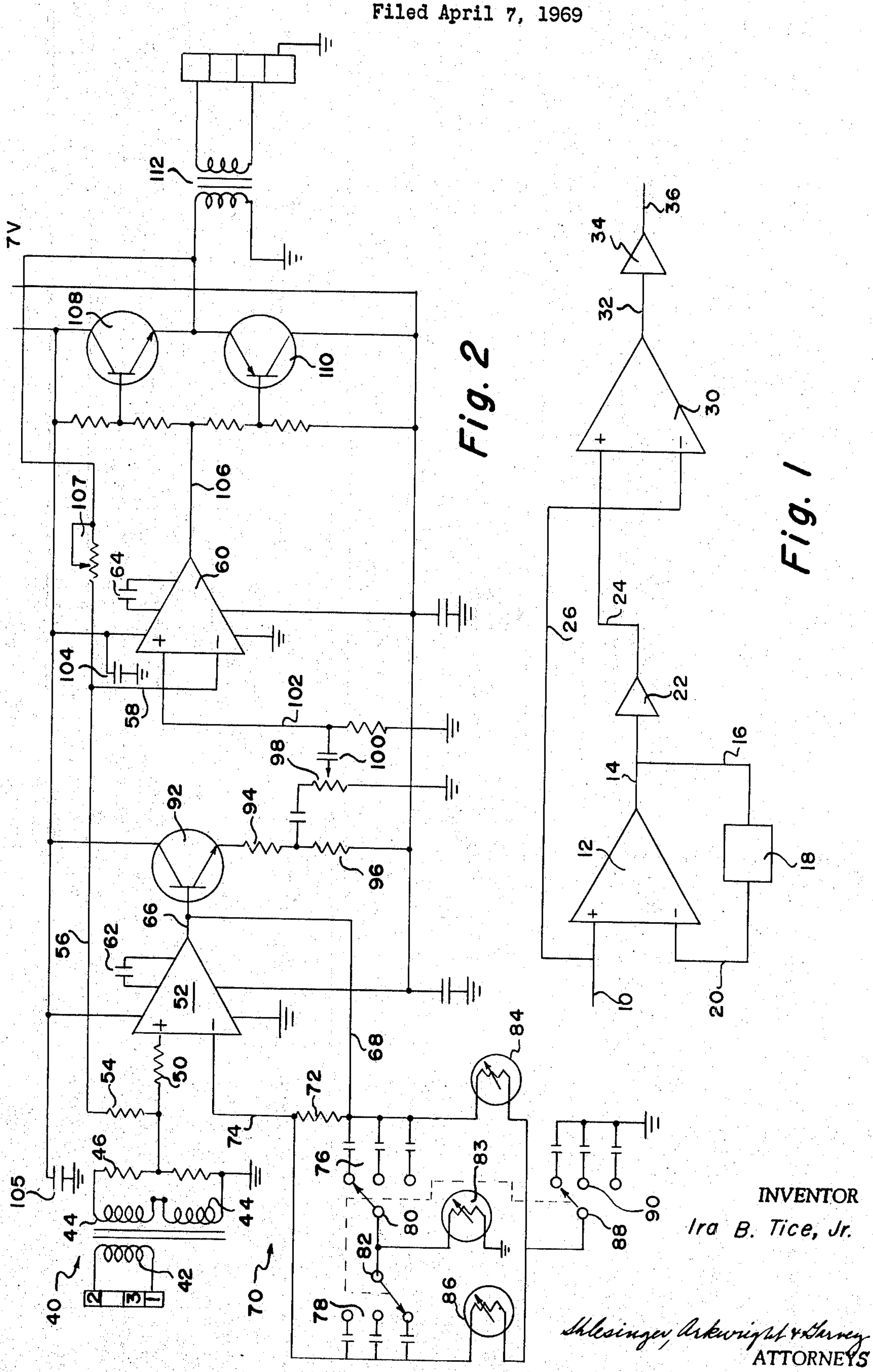
FIG. 1 is a block diagram illustrating the major components of the filter circuit.
FIG. 2 is a schematic of the filter circuit of FIG. 1, illustrating the individual components of the entire circuit.

Referring to FIG. 1, 10 is the input signal line which supplies the signal frequency containing the undesirable frequency or frequencies to the positive terminal of the differential amplifier 12.

This amplifier unit is an operational amplifier with a single ended output. The operational amplifier shown is commercially available. It is an integrated circuit unit having extremely good stability. The circuits illustrated are drawn for a Motorola 1430 unit.

The amplifier output line 14 is connected to the feedback line 16 and the frequency selective network 18. This network can be either fixed or variable. It determines, through its resonant circuitry, the frequency or frequencies to be eliminated from the incoming signal.

Frequency feedback line 20 connects the frequency selective network 18 to the negative input of the differential amplifier 12. The frequency selected in the frequency selective network will appear in the output line 14 at its peak amplitude and exactly 180° out of phase with the input signal applied to the amplifier. All of the other frequencies are attenuated by an amount dependent upon the figure of merit of the feedback network multiplied by the amplifier gain. This signal is transmitted through the buffer amplifier 22 and frequency input line 24.

Frequency input line 24 and the signal input line 26 are respectively connected to the positive and negative terminals of the differential amplifier 30. The negative terminal of the amplifier is its inverting input terminal while the positive terminal is its non-inverting terminal.

When the amplitude of the selected frequency signal at the positive or non-inverting input of amplifier 30 equals the amplitude of that same frequency in the signal supplied to the inverting input from line 26, the frequency is cancelled by an amount which equals the common mode rejection ratio of the differential amplifier 30, resulting in elimination or filter of the undesired frequency. All the remaining frequencies pass through the amplifier 30 along line 32 to the external load buffer amplifier 34 and output line 36.

If multiple first-stage differential amplifier sections, similar to differential amplifier 12, are used, with their output supplied to the positive or non-inverting terminal of amplifier 30, it is possible to eliminate a plurality of undesirable frequencies.

The schematic for the circuit of FIG. 1 is shown in FIG. 2.

The input transformer generally indicated at 40 has an input coil 42 and secondary coils 44.

The signal passes through the transformer load adjusting resistor 46 and passes along the line 48 to resistor 50 of the first differential amplifier 52. Input resistor 50 is within the amplifier and represents its input load impedance at the positive terminal.

The input signal on line 48 is also passed through resistor 54 and along lines 56 and 58 to the second differential amplifier 60. Note that the input line is connected to the negative or inverting terminal. Resistance 54 is within the amplifier 60 and represents its input impedance.

The capacitors 62 and 64 connected to amplifier 52 and 60 respectively are internal compensation capacitors for the differential amplifiers.

The single-ended output line 66 of the differential, or operational amplifier 52 is connected to the feedback line 68 which passes the signal through to the filter network 70. Feedback line 68 and filter network 70 are equivalent to feedback line 16 and frequency selective network 18 of FIG. 1. The filter selective network permits selection of one of three different frequencies, and the signal is passed through input padding resistor 72 along line 74 to the negative or inverting terminal of the differential amplifier 52.

The filter resonant circuit is composed of three parallel

R-C filter networks which are arranged in a double T configuration. A bank of three different capacitors are connected to line 68, while a matching bank of three capacitors 78 are connected to feedback input line 74. The individual capacitors are connected in the circuit through the rotating switch members 80 and 82.

Dependent resistors 83, 84 and 86 have a resistance dependent upon the light emanating from a variable light intensity circuit, not shown. It is not necessary that this type of variable resistor be used, but it has been found to be more accurate and less expensive than potentiometer circuits, and more compact.

The multiple switch element 88, which is mechanically connected to the switch members 80 and 82 permits selection of one of the three capacitors in the capacitor bank 90. The switch members 80, 82 and 88 are included as part of a stacked rotary switch. The values of the three capactiors in each of the capacitor banks are the same, and are .01, .1 and 1 microfarad respectively. The switch members 80, 82 and 88 are each connected to a common shaft, and will connect in circuit capacitors of identical value. The variable resistors 83, 84 and 86 have an identical value in circuit, and have a range from one to ten thousand ohms. These light dependent resistor units have an error substantially less than a twenty percent variance that might be expected from a three-section potentiometer.

The selected resonant frequency is supplied along line 74 to the inverting terminal of the operational, or differential amplifier unit 52.

The resulting output from the amplifier 52 which is transmitted along line 66 is a signal having an amplified undesirable frequency signal, and attenuated voltage output for the remaining frequencies. This signal is supplied to the buffer amplifier 92 which acts as an impedance. The output passes through resistor 94 which is arranged with resistor 96 as a load resistive balance network. The output signal passes through the potentiometer 98 and isolation capacitor 100 to input line 102, connecting the positive non-inverting terminal of the operational amplifier 60. Operational amplifier 60 and operational amplifier 52 are matched units having an input impedance of approximately twenty thousand ohms, and a gain of between ten and twenty in the upper frequency range between 1 and 1.2 megacycles. Preferably, they are integrated chip units.

Capacitor 104 is a bypass capacitor for the power supply to both operational amplifier units. Both of the amplifiers, 52 and 60 are operational amplifiers which are used as differential amplifier units in this circuit. Preferably, they are integrated chip units, which can be commercially purchased, and have a high degree of accuracy.

The operational amplifier 60 receives the original signal from line 58 at its inverting terminal, and the peaked undesirable frequency component of the original signal from line 102 at its non-inverting terminal. Both of the signals are combined in the amplifier and by differential concellation, the undesirable frequency is eliminated. Since the undesirable frequency supplied to the amplifier along line 102 matches that same frequency as a mirror-image, so to speak, matching it in frequency, phase, and amplitude, the output signal from the amplifier passed along line 106 has the undesirable frequency completely eliminated therefrom.

The entire system is adjusted for a gain of one through the internal gain adjustment potentiometer 107.

The "clean" signal from the operational amplifier 60 is supplied along 106 to the base of buffer amplifiers 108 and 110. These amplifiers are used to control the power gain to bring the system to a 15 db level. The output from the amplifiers is passed to the output transformer 112.

The unit has a wide tuning range, proceeding from the low audio frequencies to ten megacycles. Attenuation of unwanted frequencies is approximately 90 decibels.

It has an extremely fine tuning capability, which can be as small as one hundred cycles in width.

The filter circuit 70 is preferably the double T configuration, although other filter configurations may be used. The variable resistors 83, 84 and 86 of the filter circuit are controlled by lamps that require approximately five volts. The lamp and variable resistor units are commercially available. The filter circuit 70 illustrated will permit selection of frequencies in the entire audio range and up to ten megacycles. Distortion is as low as .2 percent with 100 db feedback.

It should be noted that several frequencies and their harmonics can simultaneously be eliminated by providing plural first stage elements which have their outputs connected to the non-inverting input of the operational amplifier 60.

Balance of the peaked undesirable frequency to match that in the original signal is provided by the potentiometer 98, and is obtained by checking the output signal until the undesirable frequency is eliminated.

It can be seen that since the output of operational amplifier 52 is not inverted, two equal signals of the same frequency are applied to the input of operational amplifier 60, resulting in cancellation of the undesirable frequency by the differential operation of amplifier 60. The cancellation is equal to the common mode rejection ratio of the differential amplifier and is usually 80 to 100 db. Band width is usually three percent on each side of selected frequency.

The output transformer 112 can be replaced by a power stage converting the circuit to a combination pre-amp, filter, power amp, resulting in a powerful audio amplifier which filters out acoustic feedback or tones in one unit.

With regard to the operational amplifiers, any such unit with a differential input can be used, with integrated or assembled units.

It should be noted that the frequency range of this circuit is limited only by the frequency response of the amplifiers.

Having thus described my invention what I claim is:

1. A filter circuit comprising:

(a) means for receiving an original signal having an undesirable waveform therein, (b) separating circuit means connected to the receiving means for isolating the undesirable wave form for use as a cancelling signal and including a frequency selective network, (c) a differential amplifier circuit having one terminal connected to the receiving means and the other terminal connected to the output of the separating circuit means for simultaneously receiving the original signal and the identical isolated undesirable wave form and adding the two signals to cancel the undesirable wave form from the original signal to thereby provide as an output signal the original signal minus the undesirable wave form.

2. The filter circuit of claim 1, wherein:

(a) the separating circuit means includes means for inverting the isolated signal.

3. The filter network as set forth in claim 1, wherein:

(a) the output of the separating circuit means is connected to a buffer amplifier and balancing circuit, whereby the isolated undesirable wave form can be adjusted to accurately match the undersirable wave form in the original signal.

4. The filter circuit as set forth in claim 1, wherein:

(a) the differential amplifier circuit is an integrated chip circuit.

5. The filter circuit as set forth in claim 1, wherein:

(a) the frequency selective network is included as part of an inverse feedback loop and contains variable circuit elements.

6. A frequency filter circuit comprising:

(a) a first and a second differential amplifier stage, each stage having a positive and a negative input line, (b) a positive input line of the first differential amplifier stage and a negative input line of the second differential amplifier stage adapted to simultaneously receive an input signal having an undesirable wave form, (c) a frequency selective circuit connected between the output of the first differential amplifier and its negative terminal to separate out the undesirable waveform, and (d) an output line of the first differential amplifier stage connected to the positive in line of the second differential amplifier stage, whereby the isolated undesirable waveform is mixed with the original input signal and the undesirable waveform is thereby cancelled.

7. The frequency filter circuit as set forth in claim 6, wherein:

(a) said frequency selective circuit is an R-C circuit, and (b) said differential amplifier stages are integrated chip circuits.

8. The filter circuit as set forth in claim 6, wherein:

(a) the frequency selective circuit is an R-C circuit which includes corresponding sets of capacitive elements which are selectively connected in circuit, and (b) several of the resistive elements of the frequency selective circuit are matched variable resistive elements.

9. The frequency filter circuit as set forth in claim 8 wherein:

(a) said adjustable resistive elements of the tunable frequency selective circuit are light responsive resistors.

10. The filter circuit as set forth in claim 6, including:

(a) circuit means for adjusting the overall gain of the entire filter circuit to one.

11. The filter network as set forth in claim 6, wherein:

(a) the output of the first differential amplifier stage is connected to a buffer amplifier and balancing circuit, whereby the isolated undesirable wave form can be adjusted to accurately match the undesirable wave form in the original signal.

12. The filter circuit as set forth in claim 6, wherein:

(a) said differential amplifier stages are integrated units, (b) a buffer is connected in circuit between the output of the first differential amplifier stage and the input of the second differential amplifier stage, and (c) said frequency selective circuit is a tunable R-C circuit.

References Cited

UNITED STATES PATENTS

| | | | |
|---|---|---|---|
| 2,672,529 | 3/1954 | Villard, Jr. | 330—109X |
| 3,353,111 | 11/1967 | Wilson | 330—69 |
| 3,387,222 | 6/1968 | Hellwarth et al. | 330—149X |

JOHN KOMINSKI, Primary Examiner

L. J. DAHL, Assistant Examiner

U.S. Cl. X.R.

330—30, 149